United States Patent
Narita et al.

(10) Patent No.: US 6,333,246 B1
(45) Date of Patent: Dec. 25, 2001

(54) SEMICONDUCTOR DEVICE MANUFACTURING METHOD USING ELECTROSTATIC CHUCK AND SEMICONDUCTOR DEVICE MANUFACTURING SYSTEM

(75) Inventors: Masaki Narita; Yukimasa Yoshida; Katsuaki Aoki; Hiroshi Fujita; Osamu Yamazaki, all of Kanagawa-ken; Toshimitsu Omine, Tokyo; Isao Matsui, Saitama-ken; Takashi O, Kanagawa-ken, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/604,722

(22) Filed: Jun. 28, 2000

(30) Foreign Application Priority Data

Jun. 30, 1999 (JP) .................................. 11-186701

(51) Int. Cl.⁷ .................................................. H01L 21/20
(52) U.S. Cl. .................. 438/584; 438/680; 438/707; 438/710; 438/714; 438/732; 438/758; 438/778
(58) Field of Search .................................. 438/584, 680, 438/707, 710, 714, 732, 758, 778

(56) References Cited

U.S. PATENT DOCUMENTS 5,539,179 * 7/1996 Nozawa et al. .................. 219/121.43
5,835,333 * 11/1998 Castro et al. .................... 361/234
6,245,190 * 6/2001 Masuda et al. .................. 156/345

FOREIGN PATENT DOCUMENTS

03028112 * 9/1992 (JP) .
10-27780    1/1998 (JP) .
10-284583  10/1998 (JP) .

* cited by examiner

Primary Examiner—John F. Niebling
Assistant Examiner—Lynne A. Gurley
(74) Attorney, Agent, or Firm—Finnegan, Henderson, Farabow, Garrett & Dunner, L.L.P

(57) ABSTRACT

A semiconductor device manufacturing method comprises the steps of placing a substrate to be processed on an electrostatic chuck on a substrate stand in a process chamber, and applying a negative voltage to the electrostatic chuck. After applying the negative voltage, the substrate is stuck onto the electrostatic chuck, a process gas is introduced into the process chamber, discharge plasma is generated, and the substrate is processed as predetermined.

17 Claims, 9 Drawing Sheets

| ELECTROSTATIC CHUCK SEQUENCE | NO. OF FAULTS | SHORTING TEST RESULT |
|---|---|---|
| SEQUENCE (Fig.7) | 34 | 78% |
| SEQUENCE 1 (Fig.1) | 12 | 91% |
| SEQUENCE 2 (Fig.9) | 9 | 94% |
| SEQUENCE 3 (Fig.10) | 11 | 91% |
| SEQUENCE 4 (Fig.11) | 6 | 97% |

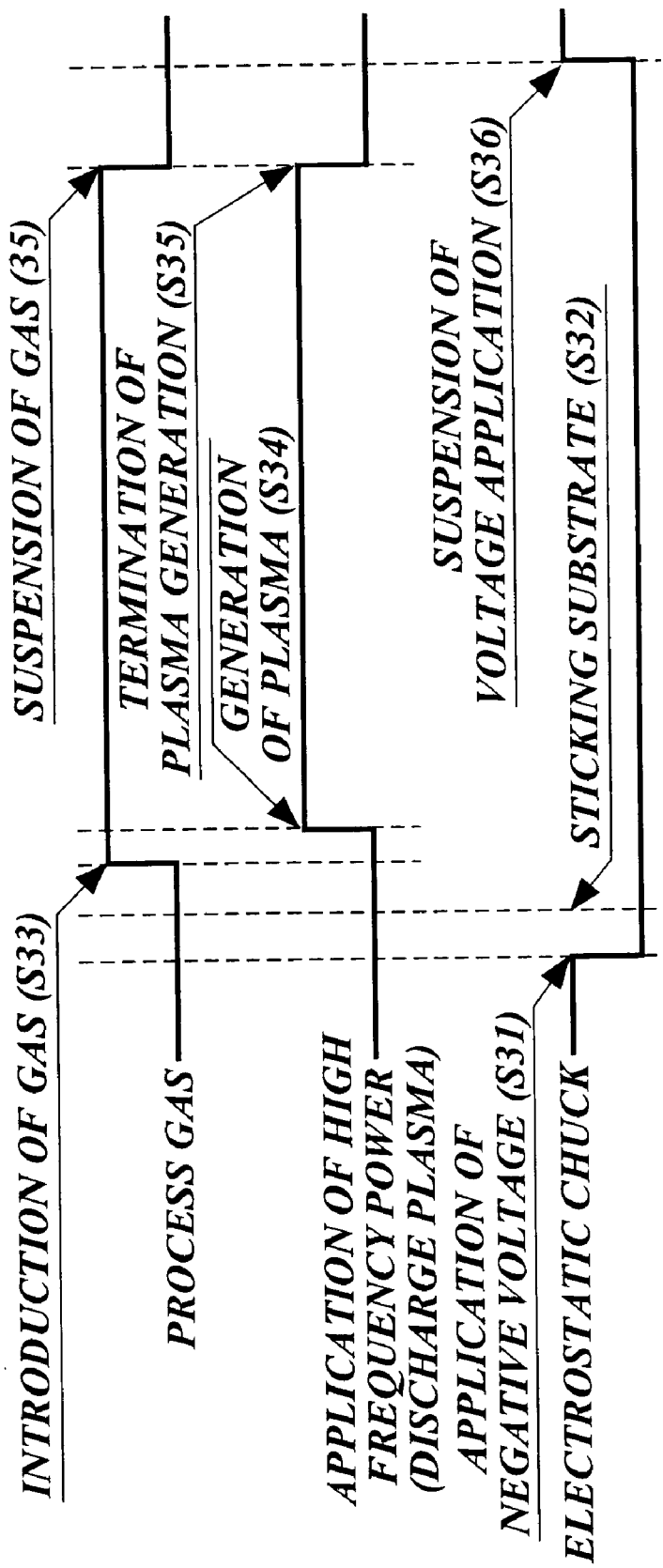

SEMICONDUCTOR DEVICE MANUFACTURING METHOD USING ELECTROSTATIC CHUCK AND SEMICONDUCTOR DEVICE MANUFACTURING SYSTEM

Cross-Reference to Related Application

This application is based upon and claims the benefit of priority from the prior Japanese Patent Application No.11-186701, filed Jun. 30, 1999, the entire contents of which are incorporated herein by reference.

BACKGROUND OF THE INVENTION

1. Field of the Invention

The present invention relates to a semiconductor device manufacturing method using an electrostatic chuck and a semiconductor device manufacturing system in which this method is applied, and particularly to a semiconductor manufacturing method including a step of applying a voltage to an electrostatic chuck which is placed in a process chamber in order to hold a substrate to be processed, and a semiconductor manufacturing system in which the foregoing method is applied.

2. Description of the Related Art

There is known a semiconductor manufacturing system in which an electrostatic chuck is placed on a substrate stand in a process chamber, and a substrate to be processed is processed while it is stuck onto the electrostatic chuck. The electrostatic chuck is constituted by a conductive layer and insulating layers covering the opposite surfaces of the conductive layer. The conductive layer is a thin copper (Cu) film or a thin tungsten (W) film or the like. The insulating layers are polyimid insulator sheets or ceramic insulator sheets or the like. With this electrostatic chuck, a DC voltage is applied to the conductive layer in order to induce electric charge on the insulating layer between the conductive layer and the substrate and to stick the substrate onto the electrostatic chuck using static electricity.

Two types of electrostatic chucks are available at present. One of them is a mono pole type electrostatic chuck including a flat conductive layer whose shape is identical to a substrate to be processed. The other is a multi pole type electrostatic chuck having a conductive layer divided into a plurality of flat parts which are shaped identical to the substrate, and are applied DC voltages having different polarities.

A semiconductor device is manufactured by a manufacturing system including the foregoing electrostatic chuck, in the following manner.

(1) First of all, a DC voltage is applied to the electrostatic chuck placed on a substrate stand in a process chamber. The substrate stand also functions as a processing electrode. Alternatively, a processing electrode is provided on the substrate stand. Because of the applied DC voltage, electric charges are accumulated on the surface of the electrostatic chuck.

(2) In this state, a substrate to be processed is brought on the electrostatic chuck and is stuck onto it. The substrate is a semiconductor wafer made of single crystal silicon (Si), for example.

(3) A process gas is introduced into the process chamber. Pressure inside the process chamber is appropriately controlled to a predetermined value. In this state, a high frequency power or the like is applied to the processing electrode, thereby generating discharge plasma in the process chamber.

(4) The surface of the substrate or a particular thin film formed on the surface of the substrate is processed as predetermined by the process gas introduced into the process chamber or discharge plasma generated in the process chamber. In this case, the thin film on the substrate is etched, or a further thin film is formed on the thin film of the substrate.

(5) Thereafter, introduction of the process gas is stopped, generation of discharge plasma is suspended, and application of the DC voltage to the electrostatic chuck is stopped.

(6) The processed substrate is released from the electrostatic chuck, and is taken out of the process chamber.

The foregoing process seems to suffer from the following problems. A positive voltage with respect to the ground potential is applied to the conductive layer of the mono pole type electrostatic chuck. Then, the substrate to be processed is stuck onto the electrostatic chuck in order to prevent the substrate from slipping or being displaced on the substrate stand, or the like. When the DC voltage is applied to the electrostatic chuck, positive charges are induced on the electrostatic chuck. Since particles present in the process chamber are usually charged to a negative voltage, they are attracted onto the surface of the electrostatic chuck. Positive charges are also induced on the surface of the substrate stuck onto the electrostatic chuck, which means that particles are also attracted onto the substrate. If dry etching is performed in this state, particles on the substrate serve as an etching mask. As a result, the substrate cannot be dry-etched as desired, and are not usable, which means reduced yield of manufactured semiconductor devices.

This kind of problem is also present in the CVD (chemical vapor deposition), sputtering and so on in which plasma is used.

SUMMARY OF THE INVENTION

The invention has been contemplated in order to overcome the foregoing problems of the related art. A first object of the invention is to provide a semiconductor device manufacturing method which can reduce particles on a substrate being processed and improve manufacturing yield of the semiconductor devices manufacturing method, and more particularly to provide a semiconductor device manufacturing method in which particles can be reduced on the substrate being process during the whole manufacturing steps, and improve manufacturing yield.

It is a second object of the invention to provide a semiconductor device manufacturing method which can reduce particles on the substrate at least immediately prior to the processing of the substrate and improve manufacturing yield.

A third object of the invention is to provide a semiconductor device manufacturing method which can reduce particles on a substrate when the substrate is being processed, and to improve manufacturing yield.

According to a fourth object of the invention, there is provided a semiconductor device manufacturing method which can not only reduce particles on a substrate but also prevent particles from sticking onto a processed substrate, and can improve manufacturing yield. With this method, it is possible to shorten time for changing steps, which means a total manufacturing time is shortened.

It is a fifth object of the invention to provide a semiconductor device manufacturing method which can prevent particles from sticking onto a substrate when it is processed using at least discharge plasma, and improve manufacturing yield.

A sixth object of the invention is to provide a semiconductor device manufacturing method which can prevent particles from sticking onto a substrate after it is processed using at least discharge plasma, and improve manufacturing yield.

A final object of the invention is to provide a semiconductor device manufacturing system which is used to manufacture a semiconductor device using any of the methods according to the first to sixth objects.

In accordance with a first feature of the invention, a semiconductor device manufacturing method comprises the steps of: (1) placing a substrate to be processed on a mono pole type electrostatic chuck on a substrate stand in a process chamber, applying a negative voltage with respect to the ground potential to the electrostatic chuck, and sticking the substrate onto the electrostatic chuck; and (2) performing predetermined processing on the substrate with the negative voltage applied to the electrostatic chuck.

The term "process chamber" refers to a process chamber of a dry etching system, plasma enhanced CVD system or sputtering system, and preferably refers to a process chamber in which plasma is generated and a substrate is processed using plasma. Further, the term includes a process chamber of the sputtering system in which plasma is used but high frequency power cannot be applied to an electrode for holding a substrate. "Plasma" is preferably generated by a plasma system such as a diode parallel plate plasma enhanced system, an electron cyclotron resonance plasma enhanced system, an inductively-coupled plasma enhanced system or the like. The term "electrostatic chuck" refers to a chuck which sticks a substrate thereto using static electricity, and preferably comprises a conductive layer sandwiched by insulating layers. The term "mono pole type electrostatic chuck" refers to not only an electrostatic chuck to which a single voltage is applied and holds a single substrate but also an electrostatic chuck which is divided into a plurality of pieces to which a single voltage is applied in order to hold a single substrate. The term "predetermined processing" refer to etch a surface of a processed substrate or a thin film formed on a surface of a processed substrate, and to form a thin film on a surface of a processed substrate or on the thin film formed on a surface of a processed substrate. The term "thin film" refers to a conductive film, insulating film or resist film. The expression "placing a substrate to be processed on an electrostatic chuck and sticking the substrate onto the electrostatic chuck" denotes that the substrate is placed on the electrostatic chuck and is then stuck onto the electrostatic chuck" and that the substrate is stuck onto the electrostatic chuck while it is being placed thereon.

In accordance with this method, negative charges are induced on the surface of the substrate by applying a negative voltage to the electrostatic chuck. Particles charged up to the negative potential can be repulsed from the substrate, so that the substrate can be processed in a state free from particles. Therefore, the substrate is free from problems caused by particles, which is effective in improving manufacturing yield.

According to a second feature of the invention, a semiconductor device manufacturing method comprises the steps of: (1) placing a substrate to be processed on a mono pole type electrostatic chuck on a substrate stand in a process chamber, applying a negative voltage with respect to the ground potential to the electrostatic chuck, and sticking the substrate onto the electrostatic chuck; and (2) performing predetermined processing on the substrate by introducing a process gas into the process chamber or by generating discharge plasma in the process chamber while the negative voltage is being applied to the electrostatic chuck.

The expression "introducing a process gas" refers to introduce a process gas for performing predetermined processing on the substrate, e.g. introducing an etching gas for etching the substrate, and introducing a film forming gas for forming a thin film on the substrate. The expression "generating discharge plasma" refers to generate discharge plasma for performing predetermined processing on the substrate, e.g. generating discharge plasma for etching the substrate, and generating discharge plasma for forming a film on the substrate.

In this method, the negative voltage is applied to the electrostatic chuck before or preferably immediately before introduction of the process gas or generation of discharge plasma in order that negative discharges are induced on the surface of the substrate. As a result, the substrate can be subject to the predetermined processing in a state free from particles, which is effective in overcoming problems caused by particles, and improving manufacturing yield.

According to a third feature of the invention, a semiconductor device method comprises the steps of: (1) placing a substrate to be processed on a mono pole type electrostatic chuck on a substrate stand in a process chamber; (2) generating discharge plasma in the process chamber; and (3) applying a positive voltage with respect to the ground potential to the electrostatic chuck, sticking the substrate onto the electrostatic chuck, and performing predetermined processing on the substrate using discharge plasma.

In this method, if no negative voltage is applicable to the electrostatic chuck, discharge plasma is generated before applying the positive voltage to the electrostatic chuck, so that an ion sheath layer is formed on the substrate. The ion sheath layer protects the substrate against particles, which enables the substrate to be processed without any particles present thereon. This is because particles float over the ion sheath layer, and cannot stick onto the substrate. Therefore, this method overcomes problems caused by particles, and improves manufacturing yield.

It is preferable that the positive voltage is applied to the electrostatic chuck in order to stick the substrate thereto immediately after generation of discharge plasma. For instance, the positive voltage is applied to the electrostatic chuck in 0.1 second to 3.0 seconds, preferably in 0.1 second, after generation of discharge plasma in order to stick the substrate to the electrostatic chuck. The substrate can be brought into close contact with the substrate stand via the electrostatic chuck immediately after starting the predetermined processing, which is effective in cooling the substrate quickly. Therefore, the substrate can be subject to the predetermined processing at an optimum temperature, so that manufacturing yield of the method can be improved.

According to a fourth feature of the invention, the method of the third feature further includes the step of removing the positive potential from the electrostatic chuck and terminating generation of discharge plasma after performing the predetermined processing on the substrate.

In this method, the positive voltage is removed from the electrostatic chuck before terminating the generation of discharge plasma. Therefore, it is possible to protect the substrate against particles which stick to it because of the positive voltage applied to the electrostatic chuck after terminating the generation of discharge plasma. Since an ion sheath layer is formed on the substrate due to discharge plasma, the substrate is protected against particles during generation of discharge plasma. As a result, the substrate can be processed in a state free from particles, which is effective in improving manufacturing yield.

With this method, it is preferable that the positive voltage applied to the electrostatic chuck should be removed immediately before the end of discharge plasma generation. For instance, the positive voltage is removed from the electrostatic chuck 0.1 second to 3.0 seconds, preferably 0.1 second, to the termination of the discharge plasma generation. Since removal of the positive voltage and termination of plasma generation are performed in a very short time, it is possible to shorten the time to manufacture semiconductor devices.

In accordance with a fifth feature of the invention, a semiconductor device manufacturing method comprises the steps of. (1) placing a substrate to be process on a mono pole type electrostatic chuck on a substrate stand in a process chamber; (2) introducing a process gas into the process chamber, generating discharge plasma, and performing predetermined processing on the substrate; and (3) applying a negative voltage with respect to the ground potential to the electrostatic chuck and at least terminating the generation of discharge plasma while the substrate is being stuck onto the electrostatic chuck.

The expression "at least terminating the generation of discharge plasma" refers to terminate the generation of discharge plasma and both to terminate the generation of discharge plasma and introduction of a process gas.

In this method, the ion sheath layer disappears when the generation of discharge plasma is terminated, so that particles tend to stick onto the processed substrate. However, since the negative voltage is applied to the electrostatic chuck after the termination of discharge plasma generation, it is possible to prevent particles from sticking onto the substrate. Therefore, the substrate can be processed in a state free from particles, which can improve manufacturing yield.

According to a sixth feature of the invention, a semiconductor device manufacturing method comprises the steps of: (1) placing a substrate to be processed on a mono pole type electrostatic chuck on a substrate stand in a process chamber; (2) introducing a process gas into the process chamber, generating discharge plasma, and processing the substrate as predetermined; (3) at least terminating the generation of discharge plasma; (4) applying a negative voltage respect to the ground potential to the electrostatic chuck with prior to the step (1) or prior to the step (3), and sticking the substrate onto the electrostatic chuck; and (5) removing the negative voltage from the electrostatic chuck after the step (3).

In this method, an ion sheath layer formed by discharge plasma disappears when the generation of discharge plasma is terminated. Although particles tend to stick onto the substrate, they cannot reach the substrate because they are repulsed since the negative voltage is applied to the electrostatic chuck after the termination of discharge plasma generation. The substrate can be processed in a state free from particles, which can improve manufacturing yield.

According to a seventh feature of the invention, a semiconductor device manufacturing system comprises: (1) a mono pole type electrostatic chuck placed on a substrate stand in a process chamber; (2) a power generating circuit including a positive voltage supply for applying a positive voltage with respect to the ground potential to the electrostatic chuck, and a negative voltage supply for applying a negative voltage to the electrostatic chuck; (3) a power supply selecting circuit for selectively operating the positive voltage supply or the negative voltage supply of the power generating circuit; and (4) a power supply control circuit for controlling the operation of the power transfer circuit.

The semiconductor device manufacturing system includes the power generating circuit with the negative and positive power sources, power transfer circuit, and power supply control circuit, and can process the substrate by removing particles therefrom and by carrying out an optimum electrostatic chuck sequence.

BRIEF DESCRIPTION OF THE DRAWINGS

FIG. 11 is a time chart showing a sequence of the electrostatic chuck in a fourth embodiment.

DESCRIPTION OF THE PREFERRED EMBODIMENTS

The invention will be described with reference to the preferred embodiments. First of all, the inventor has conducted the following experiments in order to review the relationship between a sequence of an electrostatic chuck and behavior of particles during processing using plasma.

EXPERIMENTS AND OBSERVATION RESULTS

CONFIGURATION OF EXPERIMENTAL SYSTEM

Figure 2:
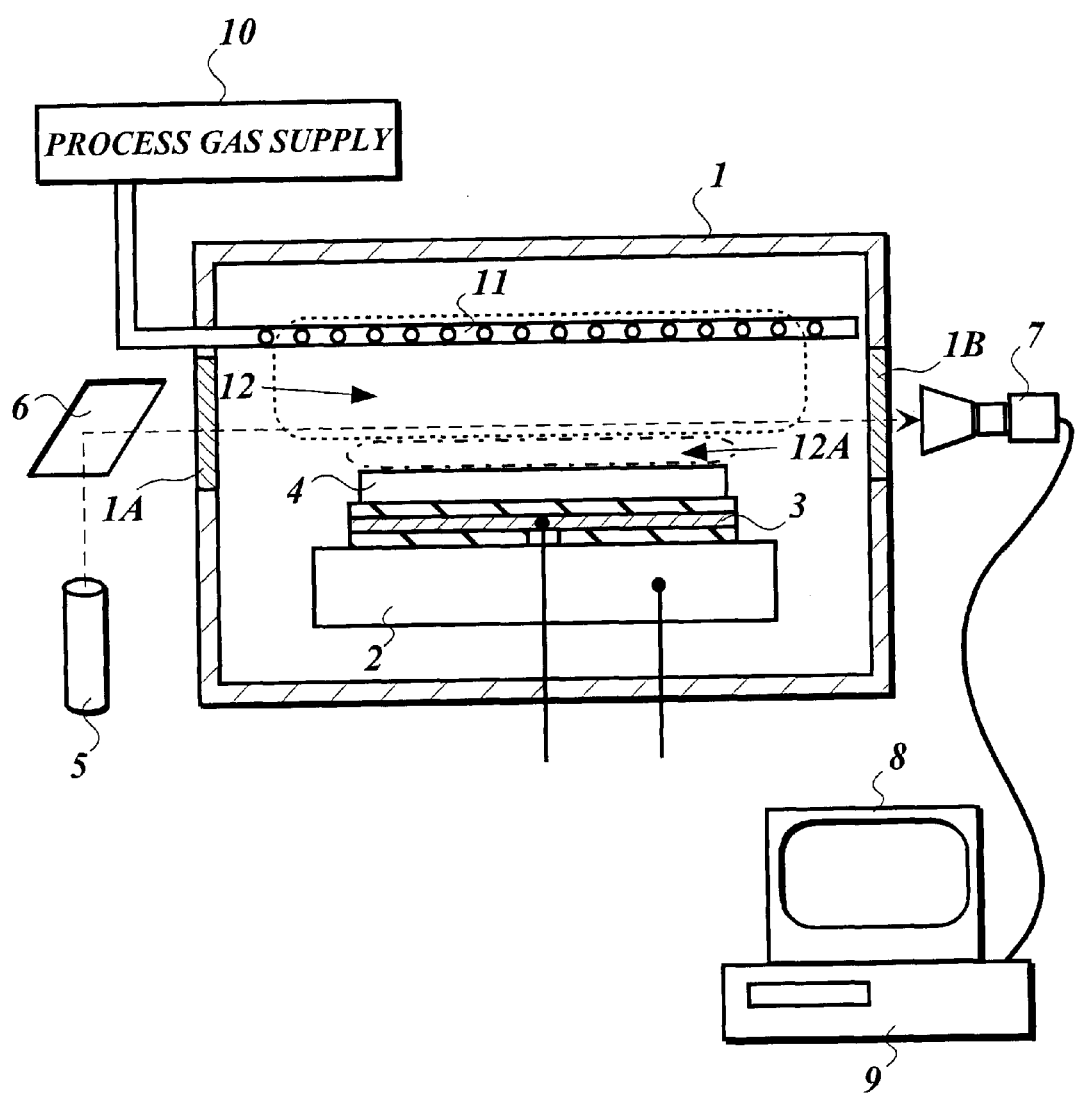
FIG. 2 is a schematic view of an experimental system used to review the relationship between the electrostatic chuck sequence and behavior of particles during processing using plasma.
Figure 3:
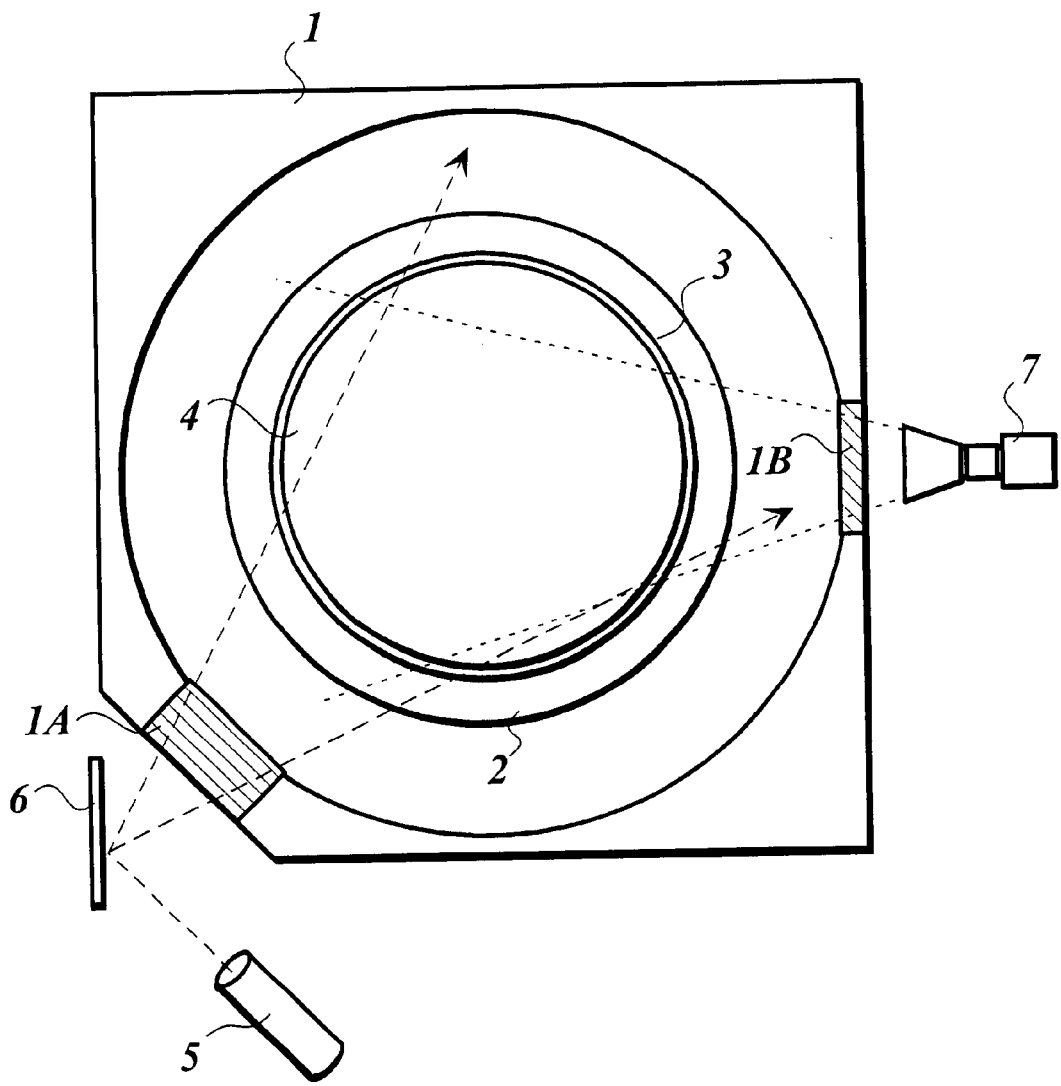
FIG. 3 is a top view of the experimental system.

FIGS. 2 and 3 show the configuration of an experimental system for reviewing the relationship between a sequence of an electrostatic chuck and behavior of particles during processing using plasma. An essential part of the experimental system is a dry etching system, e.g. a magnetron reactive ion etching (RIE) system, which comprises at least a process chamber 1, a substrate stand 2 housed in the process chamber 1, an electrostatic chuck 3 placed on the substrate stand 2, and a substrate to be processed and stuck onto the electrostatic chuck 3.

Figure 4:
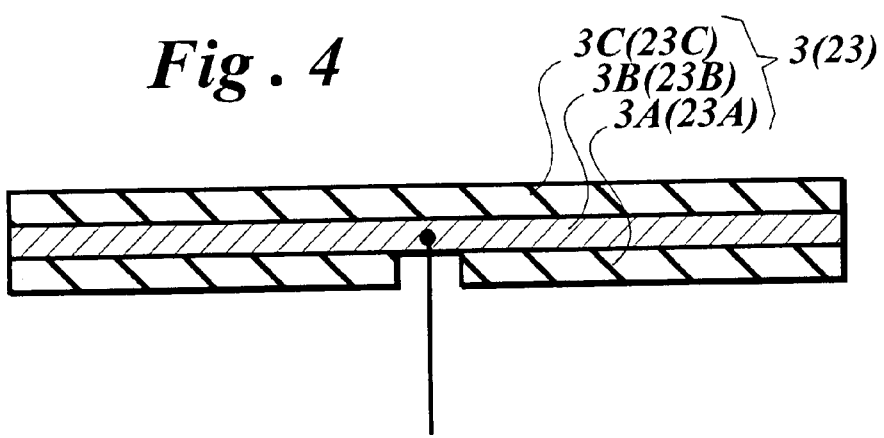
FIG. 4 is a sectional view of the electrostatic chuck of the invention.

Referring to FIG. 4, the electrostatic chuck 3 is constituted by a conductive layer 3B with its upper and lower surfaces sandwiched by insulating layers 3A and 3C. The conductive layer 3B may be practically a thin film of Cu, W or the like. The insulating layers 3A and 3C are practically insulating films made of polyimide resin, ceramics and so on. The conductive layer 3B of the electrostatic chuck 3 is as flat as the substrate to be processed, and is applied a mono pole DC voltage. In other words, the electrostatic chuck is of a mono pole type.

The process chamber 1 is provided with a window 1A for receiving laser beams and a window 1B for discharging the laser beams. These windows 1A and 1B are made of quartz glass. The following are provided outside the process chamber 1: an argon (Ar) laser oscillator 5; an optical mirror 6 for irradiating within a predetermined angle laser beams from the laser oscillator 5 into the process chamber 1 via the window 1A, and for letting the laser beams scan the substrate in parallel therewith; a high sensitivity CCD camera 7 for detecting laser beam irradiated onto the substrate, via the window 1B, a video recorder 9 for recording image data obtained by the high sensitivity CCD camera 7; and a monitor 8 for displaying image data obtained by the CCD camera 7. The foregoing components constitute the experimental system. In the experiments, a semiconductor wafer made of single crystal silicon were used as the substrate 4.

In the experimental system shown in FIGS. 2 and 3, laser beams oscillated by the laser oscillator 5 were irradiated into the process chamber 1 by the optical mirror 6, and scanned the process chamber 1. The laser beam is dispersed by particles, were caught by the high sensitivity CCD camera 7, and were converted into image information by the CCD camera 7. The image information is displayed on the monitor 8, and were recorded by the video device 9 if necessary.

The process chamber 1 is further provided with a process gas supply 10 for supplying a process gas, and a gas nozzle 11 at an upper part of the process chamber 1.

RESULT OF EXPERIMENT 1

First of all, the substrate 4 to be processed was brought into the process chamber 1 from a load lock process chamber (not shown). A 1.5 kV positive voltage was applied to the conductive layer 3B of the electrostatic chuck 3 prior to placing the substrate on the substrate stand 2. A dispersed state of the laser beams was observed by the experimental system shown in FIGS. 2 and 3 in order to detect behavior of particles.

It was confirmed that particles were attracted onto the surface of the electrostatic chuck 3 from an area around the substrate stand 2, and stuck onto the electrostatic chuck 3.

RESULT OF EXPERIMENT 2

Next, the substrate 4 was moved down to the substrate stand 2, brought into contact with and stuck onto the electrostatic chuck 3 the electrostatic chuck 3. In this state, a dispersed state of the laser beams was observed in order to check behavior of particles.

It was confirmed that particles stuck onto the substrate at an instant the substrate was stuck onto the electrostatic chuck 3.

RESULT OF EXPERIMENT 3

A process gas was then introduced into the process chamber 1 from the process gas supply 10 via the gas nozzle 11. In this state, a dispersed state of the laser beams was observed in order to check behavior of particles.

It was confirmed that particles stuck onto the substrate when the process gas was introduced. Although it was not possible to discover where particles were produced, they seemed to be produced in the gas nozzle 11. This is because particles stuck onto the substrate in concurrent with the introduction of the process gas.

RESULT OF EXPERIMENT 4

When pressure in the process chamber 1 became a predetermined value after the introduction of the process gas, high frequency power of 13.56 MHz was applied to the substrate stand 2 (i.e. a cathode electrode) in order to generate discharge plasma. In this state, a dispersed state of the laser beam was observed in order to check behavior of particles.

It was confirmed that a few particles present on the substrate 4 during the generation of discharge plasma left on the substrate 4. Further, as shown in FIG. 2, an ion sheath layer 12A was formed between the surface of the substrate 4 and discharge plasma 12 because of the generation of discharge plasma 12. Particles were found to float over the ion sheath layer 12A. As is well-known, particles in the discharge plasma 12 are negatively charged, so that they are electrically repulsed from the ion sheath layer 12A having a negative potential gradient.

RESULT OF EXPERIMENT 5

Generation of discharge plasma was continued for a predetermined period while application of the DC voltage to the electrostatic chuck 3 was suspended. Thereafter, high frequency power applied to the substrate stand 2 was suspended, so that discharge plasma 12 disappeared. In this state, a dispersed state of the laser beams was observed in order to check behavior of particles.

It was confirmed that a lot of particles stuck onto the substrate 4. This is because the ion sheath layer 12A, which had been present due to the generation of discharge plasma 12, disappeared, and particles floating over the ion sheath layer 12A lost their repulsion force, and fell onto the substrate 4.

Based on the Results of Experiments 1 to 5, the inventor has designed the following sequences for the electrostatic chuck, and observed behavior of particles in respective sequences using the foregoing experimental system.

RESULT OF NEW EXPERIMENT 1

First of all, a substrate 4 to be processed was brought into the process chamber 1 from the load lock process chamber. A 1.5 kV negative voltage was applied to the conductive layer 3B of the electrostatic chuck 3 on the substrate stand 2. In this state, dispersion of the laser beams was observed by the experimental system shown in FIGS. 2 and 3 in order to check behavior of particles.

It was confirmed that particles were not attracted to the surface of the electrostatic chuck 3 from an area around the substrate stand 2, and that no particles stuck onto the electrostatic chuck 3, contrary to the Result of Experiment 1.

RESULT OF NEW EXPERIMENT 2

The substrate 4 was moved down on the substrate stand 2, was brought into contact with the electrostatic chuck 3 and was stuck onto the electrostatic chuck 3. In this state, dispersion of the laser beams was observed in order to check behavior of particles.

It was confirmed that particles on or stuck onto the substrate were scattered out of the substrate 4 at an instant the substrate 4 was stuck onto the electrostatic chuck 3, and that no particles remained sticking onto the substrate, contrary to the Experiment Result 2. Further, no particles seemed to be attracted to the substrate 4 from the area around the substrate stand 2.

RESULT OF NEW EXPERIMENT 3

The process gas was introduced into the process chamber 1 from the process gay supply 10 using the gas nozzle 11. In this state, dispersion of the laser beams was observed in order to check behavior of particles.

It was confirmed that a few particles were present when the process gas was introduced, but they did not stick onto the substrate 4 but scattered out of the substrate 4.

RESULT OF NEW EXPERIMENT 4

When pressure in the process chamber 1 became a predetermined value after the introduction of the process gas, high frequency power of 13.56 MHz was applied to the substrate stand 2 (i.e. the cathode electrode) in order to generate discharge plasma. In this state, a dispersed state of the laser beams was observed in order to check behavior of particles.

It was confirmed that a few particles floated over the substrate 4 because of the ion sheath layer 12A as described in the Result of Experiment 4.

RESULT OF NEW EXPERIMENT 5

Generation of discharge plasma was continued for a predetermined period while application of the DC voltage to the electrostatic chuck 3 was suspended. Thereafter, high frequency power applied to the substrate stand 2 was suspended, so that discharge plasma 12 disappeared. Behavior of particles was the same as that described with reference to the Result of Experiment 5. The ion sheath layer 12A disappeared, and particles floating on the ion sheath layer 12A stuck onto the substrate 4.

After suspending the generation of discharge plasma, a negative voltage was applied to the electrostatic chuck 3 for a predetermined time period, with respect to the ground potential. In this state, dispersed state of the laser beams was observed in order to check behavior of particles.

It was confirmed that an extensively reduced number of particles fell onto the substrate, and that particles on the substrate 4 were scattered out of the substrate 4.

On the basis of the Results of Experiments 1 to 5 and the Results of New Experiments 1 to 5, the following conclusion has been reached.

(1) When the positive DC voltage is applied to the electrostatic chuck 3 (shown in FIG. 4), positive charges are also induced on the surface of the insulating layer 3C of the electrostatic chuck 3, so that particles stick onto the electrostatic chuck 3.

(2) Positive charges are induced on the surface of the substrate 4 at an instant the substrate 4 is placed on the electrostatic chuck 3 to which the positive DC voltage has been applied. Particles stick onto the substrate 4. It is known that particles floating in the plasma are negatively charged and are attracted to positive charge before the generation of discharge plasma is started. It is not clear why particles are negatively charged.

(3) Conversely, when the negative DC voltage is applied to the electrostatic chuck 3, negative charges are induced on the insulating layer 3C, so that no particles stick onto the electrostatic chuck 3.

(4) Negative charges are induced on the surface of the substrate 4 at an instant the substrate 4 is placed on the electrostatic applied the negative voltage. Therefore, no particles stick onto the substrate 4.

(5) If the positive DC voltage is applied to the electrostatic chuck 3 after starting to generate discharge plasma, old particles present on the substrate 4 cannot be removed. However, it is possible to prevent new particles from sticking onto the electrostatic chuck 3 or onto the substrate 4 using the ion sheath layer 12A.

(6) When the negative DC voltage is being applied to the electrostatic chuck 3 after suspending the generation of discharge plasma, it is possible to prevent particles, floating on the oil sheath layer 12A, from falling onto the substrate 4. This is because particles are continuously negatively charged. It is inferred that when the negative DC voltage is applied to the electrostatic chuck 3, particles are repulsed and scattered from the substrate 4 because of the negative charges thereon.

The negative DC voltage remains applied to the electrostatic chuck 3 after the interruption of discharge plasma. Therefore, residual charges are present even after the suspension of the negative DC voltage, so that the substrate 4 remains sticking onto the electrostatic chuck 3. However, the substrate 4 can be released from the electrostatic chuck 3 by introducing a predetermined gas into the process chamber 1 for several seconds.

(7) Finally, even if the positive DC voltage is applied to the electrostatic chuck 3 while processing the substrate 4 as predetermined, i.e. while dry-etching the substrate 4, no particles stick onto the substrate 4 once the negative DC voltage is applied to the electrostatic chuck 3 immediately before completing the processing, and the application of the negative DC voltage is interrupted after the generation of discharge plasma 12.

First Embodiment

A first embodiment of the invention has been designed on the basis of the Results of Experiments 1 to 5 and the Results of New Experiments 1 to 5, and relates to a method of manufacturing a semiconductor device in which an optimum sequence of an electrostatic chuck is included, and a system for manufacturing a semiconductor device according to this method.

Figure 5:
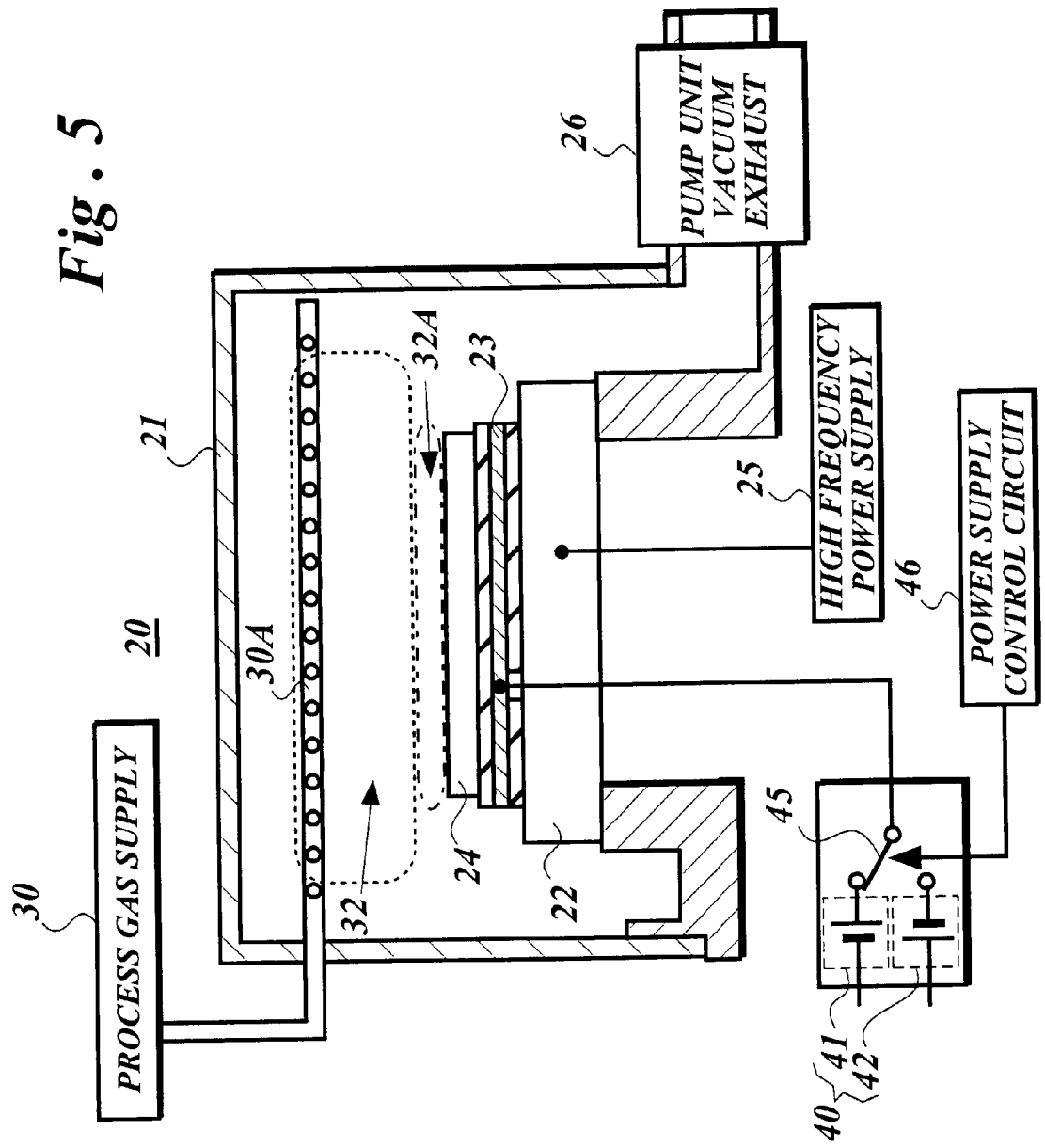
FIG. 5 shows the configuration of a semiconductor device manufacturing system related to the first embodiment of the invention.

In the first embodiment, a semiconductor device manufacturing system 20 is configured as shown in FIG. 5. A magnetron RIE system is used as the semiconductor device manufacturing system 20, which comprises at least a process chamber (a reaction chamber) 21, a substrate stand 22 housed in the process chamber 21, an electrostatic chuck 23 placed on the substrate stand 22, and a substrate 24 stuck onto the electrostatic chuck 23.

The electrostatic chuck 23 is identical to the electrostatic chuck 3 shown in FIG. 4. Specifically, the electrostatic chuck 23 is constituted by a conductive layer 23B and insulating layers 23A and 23C sandwiching the conductive layer 23B therebetween. The conductive layer 23B is practically a thin Cu film, and the insulating layers 23A and 23C are practically thin films made of polyimide group resin. The conductive layer 23B is stuck to the insulating layers 23A and 23C using an adhesive (not shown), and is as flat as the substrate 24. A single DC voltage is applied to the conductive layer 23B, i.e. the electrostatic chuck 23 has a mono pole type structure.

Referring to FIG. 5, the semiconductor device manufacturing system 20 (called "the system 20" hereinafter)

includes a power generating circuit 40 for supplying a DC voltage to the electrostatic chuck 23. The power generating circuit 40 has a positive voltage supply 41 for supplying a positive DC voltage with respect to the ground potential to the electrostatic chuck 23, and a negative voltage supply 42 for supplying a negative DC voltage to the electrostatic chuck 23 with respect to the ground potential. The system 20 is also provided with a power supply selecting circuit 45 for selectively operating the positive or negative voltage supply 41 or 42, and a power supply control circuit 46 for controlling the operation of the power supply selecting circuit 45. The power supply control circuit 46 practically includes a micro computer (CPU), and the power supply selection by software.

In addition, the system 20 includes a high frequency power supply 25 electrically connected to the substrate stand 22, a vacuum pump unit 26 for controlling inner pressure of the process chamber 21, and a process gas supply 30 for providing the process chamber 21 with a process gas via a gas nozzle 30A. The gas nozzle 30A has its one end connected to the process gas supply 30 and the other end thereof arranged annularly in order to spray the process gas.

Figures 6, 8:
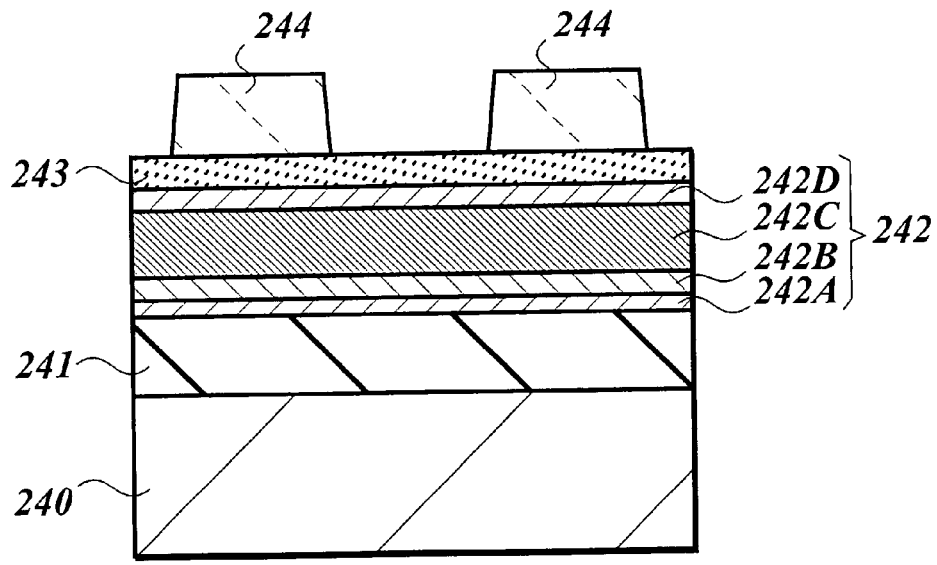
FIG. 6 is a sectional view of a substrate to be processed substrate according to the first embodiment of the invention.
FIG. 8 shows the relationship between the electrostatic chuck sequence, the number of bridging faults, and results of bridging test.

FIG. 6 is a sectional view of the substrate 24 according to the first embodiment. With the system 20, the substrate 24 to be dry-etched is a semiconductor wafer made of single crystal silicon (Si). The semiconductor wafer includes an Si single crystal substrate 240, an inter-layer insulating film 241 placed on the Si single crystal substrate 240, wirings 242, an organic anti-reflection coating 243 and a resist film 244, all of which are laid over one after another.

The inter-layer insulating film 241 extends over elements such as transistors, resistors, capacitors and so on formed on the surface of the Si single crystal substrate 240, and connects these elements to the wirings 242. The inter-layer insulating film 241 is practically a silicon oxide film ($SiO_2$) having a thickness of 1000 nm, for example. The $SiO_2$ film can be formed by the reduced pressure CVD method.

Each wiring 242 are made of a titanium (Ti) film 242A, a titanium nitride (TiN) film 242B, aluminum alloy (Al—Cu, Al—Si or Al—Cu—Si) film 242C, and a TiN film 242D which are laid over one after another. The Ti film 242A and TiN film 242B are used as barrier metal films, and are formed by the sputtering method. For example, the Ti film 242A is 20 nm to 30 nm thick, and the TiN film 242B is 60 nm to 80 nm thick. In order to prevent migration, each wiring 242C is made of a aluminum alloy film containing aluminum as a main component and added with 0.5% Cu, is formed by the sputtering, and has a thickness of 500 nm to 900 nm. The TiN film 242D is used as a barrier metal film, is formed by the sputtering, and has a thickness of 60 nm to 80 nm.

The organic anti-reflection coating 243 functions as an anti-halation backing when exposing the resist film 244 at the top, and is practically a spin-coated resin film containing a principal chain of C. The resist film 244 is a sensitive photoresist film, for example. The resist film 244 is exposed and developed, and has a predetermined wiring pattern transferred thereto from a photo-mask.

In the system 20, the resist film 244 is used as an etching mask in order to etch and pattern the organic anti-reflection coating 243. The patterned anti-reflection coating 243 then is used as an etching mask for patterning the wirings 242. A width of each wiring 242 and a space (line and space) between two adjacent wirings 242 are preferably set to be 0.20 μm. The anti-reflection coating 243 is very useful for anti-halation during minute machining processes such patterning gate electrodes, and making contact holes and through-holes on insulated gate field effect transistors (IGFET).

Figure 1:
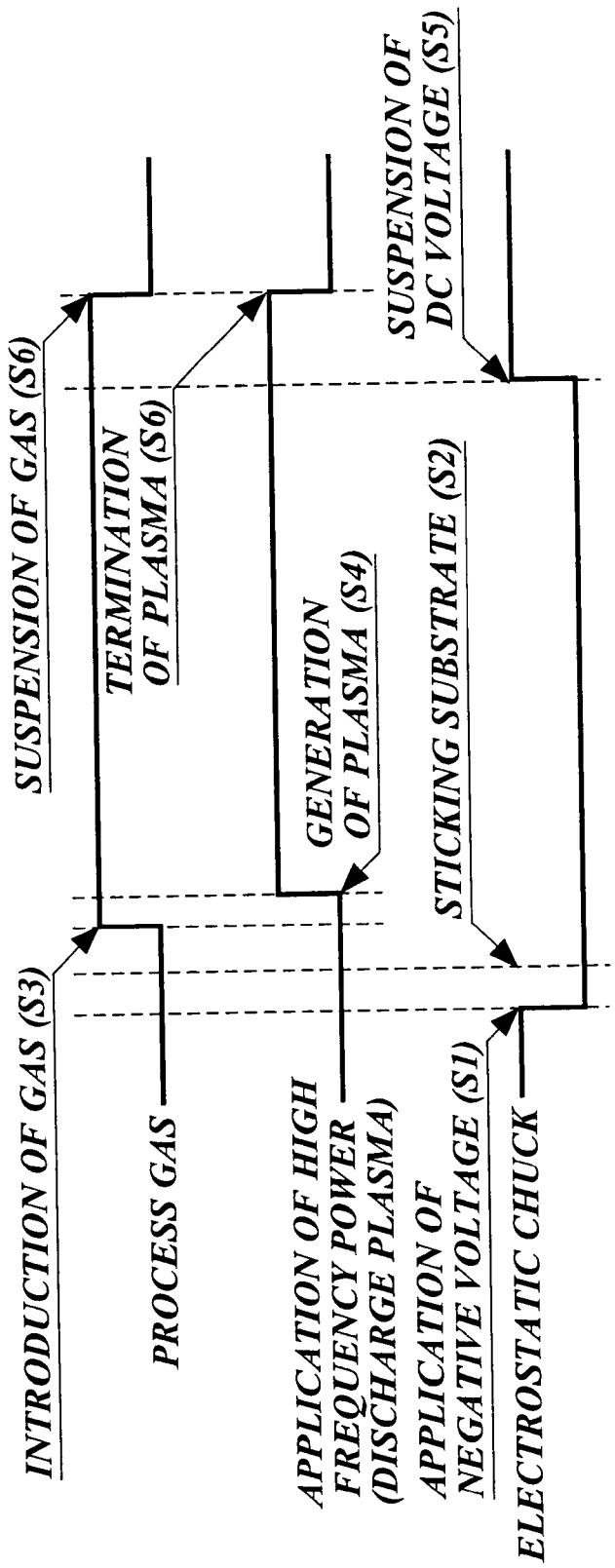
FIG. 1 is a time chart showing a sequence of an electrostatic chuck according to a first embodiment of the invention.

Referring to FIG. 1, FIG. 5, and FIG. 6, the method of manufacturing a semiconductor device will be described, in which the optimum sequence of the electrostatic chuck is carried out. FIG. 1 is a time chart showing the sequence of the electrostatic chuck.

(1) First of all, the substrate 24 to be processed is brought into the process chamber 21 from the load lock chamber (not shown). Prior to placing the substrate 24 on the substrate stand 22, the 1.5 kV negative DC voltage with respect to the ground potential is applied to the conductive layer 23B (shown in FIG. 4) (step S1). As shown in FIG. 5, the negative DC voltage can be obtained by operating the power supply selecting circuit 45 in response to a control signal from the power supply control circuit 46 and connecting the electrostatic chuck 23 and the negative power supply 42. Application of the negative DC voltage to the electrostatic chuck 23 enables particles to be removed from the surface of the electrostatic chuck 23 as described with reference to Result of New Experiment 1. Referring to FIG. 6, the substrate 24 is constituted by the Si single crystal substrate 240, and the anti-reflection coating 243 laid thereon, and the photoresist film 244 formed on the anti-reflection coating 243 and provided with a predetermined wiring pattern transferred thereon.

(2) With the electrostatic chuck 23 applied the negative DC voltage, the substrate 24 is moved down onto the substrate stand 22 and is stuck onto the electrostatic chuck 23 (step S2). As described with reference to the Result of New Experiment 2, particles can be removed from the surface of the substrate 24 at an instant the substrate 24 is stuck onto the electrostatic chuck 23.

(3) Thereafter, the process gas is introduced into the process chamber 21 from the process gas supply 30 via the gas nozzle 30A (step S3). The process gas is a mixture of tetrafluoro fluoride carbon ($CF_4$) and oxygen ($O_2$), for example. As described with reference to the Result of New Experiment 4, a few particles may be generated when introducing the process gas. However, the negative DC voltage is applied to the electrostatic chuck 23, and the negative charges are induced on the substrate 24, so that particles can be removed from the electrostatic chuck 23 and the substrate 24.

(4) When the pressure of the process chamber 21 reaches the predetermined value, e.g. approximately $5.3 \times 10^3$ mPa, following the introduction of the process gas, the high frequency power supply 25 supplies 800 W high frequency power to the substrate stand (cathode electrode) 22, thereby generating discharge plasma 32 (step S4) as shown in FIG. 5. In this state, the substrate 24 is dry-etched for approximately 20 second to 40 seconds. Time length of dry etching depends upon a thickness of the anti-reflection coating 243. Due to the generation of discharge plasma 32, the ion sheath layer 32A is present between the surface of the substrate 24 and discharge plasma 32. Particles float over the ion sheath layer 32A which is on the substrate 24, and will not fall down onto and stick onto the surface of the substrate 24.

(5) After the lapse of a predetermined time period, the negative DC voltage applied to the electrostatic chuck 23 is suspended while discharge plasma 32 is being generated and the process gas is being introduced (step S5). Suspension of the negative DC voltage is accomplished by operating the power supply selecting circuit 45 in response to the control signal from the power control circuit 46, and by disconnecting the negative power supply 42 and the electrostatic chuck 23. As described with reference to the Result of Experiment 4, the ion sheath layer 32A is formed during the generation of discharge plasma 32, and particles are floating over the ion sheath layer 32A, so that no particles will stick onto the substrate 24.

(6) When the process gas is suspended and generation of discharge plasma 32 is stopped (step S6), dry-etching is completed. The dry-etched substrate 24 is carried out of the process chamber 21 to an unload chamber (not shown).

The method according to the first embodiment comprises the steps of applying the negative DC voltage to the electrostatic chuck 23 and sticking the substrate 24 onto the electrostatic chuck 23, and performing the predetermined processing on the substrate 24 with the negative DC voltage applied to the electrostatic chuck 23. Therefore, negative charges can be induced on the surfaces of the electrostatic chuck 23 and substrate 24, so that the substrate 24 can be processed as predetermined with negatively charged particles repulsed from the surface of the substrate 24. As a result, there is no problem caused by particles, and manufacturing yield of this method can be improved.

According to the method of the first embodiment, the negative DC voltage is applied to the electrostatic chuck 23. In this state, the process gas is introduced into the process chamber 21, or discharge plasma 32 is generated, thereby processing the substrate 24 as predetermined. In other words, the negative DC voltage is applied to the electrostatic chuck 23 before or preferably immediately before the introduction of the process gas or generation of discharge plasma 32, so that negative charges can be induced on the substrate 24. Negatively charged particles are repulsed from the surface of the substrate 24, which enables the substrate 24 to be processed without any particles thereon. Therefore, it is possible overcome problems caused by particles, and to improve the manufacturing yield.

Figure 7:
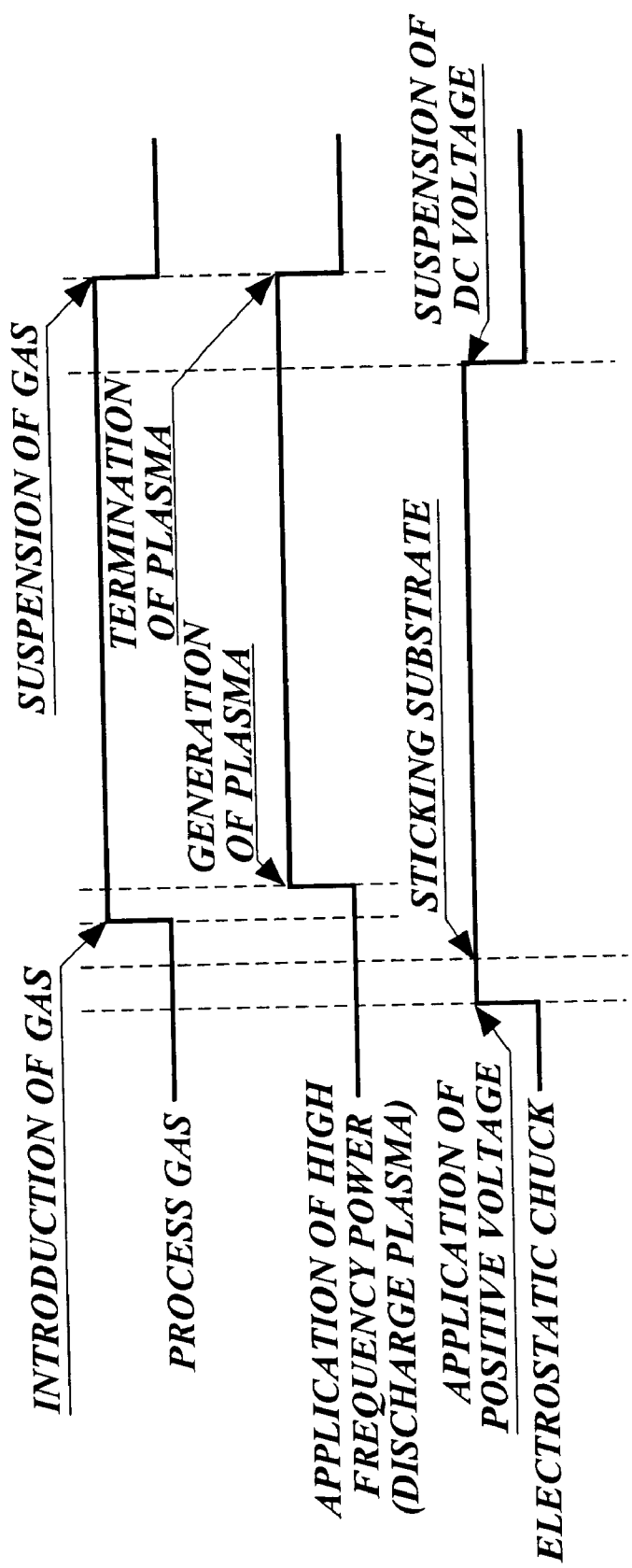
FIG. 7 is a time chart showing a sequence of the electrostatic chuck in the first embodiment.

FIG. 7 is a time chart showing the sequence of a conventional electrostatic chuck. Further, FIG. 8 shows the relationship between the sequences of the electrostatic of the present invention, the number faults, and results of shorting test. In the sequence of FIG. 7, the positive DC voltage is applied to the electrostatic chuck, and then the process gas is introduced into the process chamber, and discharge plasma is generated. The sequence of the electrostatic chuck 23 of FIG. 1 differs from that of FIG. 7 in that the negative DC voltage is applied to the electrostatic chuck.

In FIG. 8, "the number of faults" represents a quantity of shorted portions or the like. Faults were counted after the anti-reflection coating 243 was dry-etched, the wirings 242 were patterned using the anti-reflection coating 243 and the resist film 244 thereon as an etching mask, the resist film 244 was stripped, and then the substrate 24 was thermally processed. "Shorting test result" represents results of voltages measured between adjacent wirings 243. The larger the values, the fewer the shorted portions.

Referring to FIG. 8, the method having the electrostatic chuck sequence shown in FIG. 7 has 34 faults and a shorting test result of 78%, while the method having the electrostatic chuck 23 sequence of the present invention shown in FIG. 1 has is improved and 12 faults and a shorting test result of 91%.

In the first embodiment, the electrostatic chuck power generating circuit 40 with at least the negative voltage supply 41 is effective in simplifying the sequence of the electrostatic chuck 23.

Second Embodiment

Figure 9:
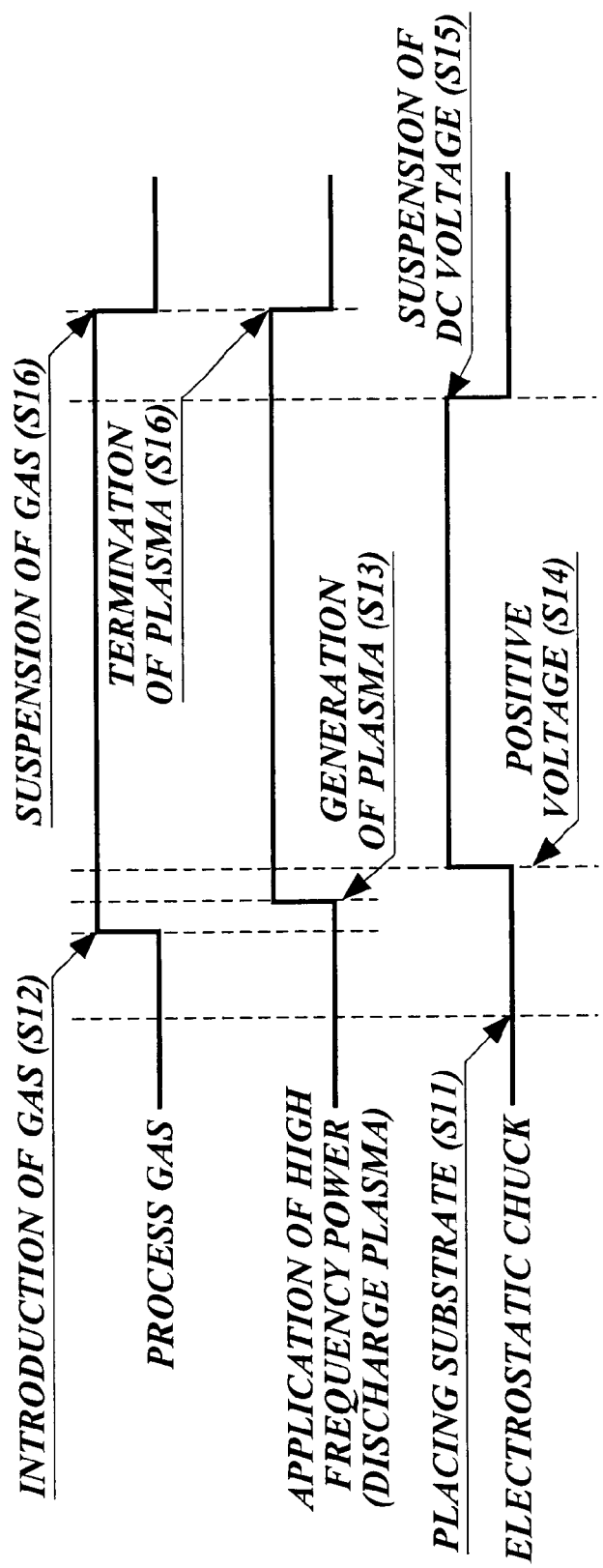
FIG. 9 is a time chart showing a sequence of the electrostatic chuck in a second embodiment.

A semiconductor device manufacturing method of the second embodiment features a sequence for applying a positive DC voltage to the electrostatic chuck. FIG. 9 is a time chart showing the sequence of the electrostatic chuck. The following description is made also referring to FIG. 4, FIG. 5, and FIG. 6 which are referred to in the description of the first embodiment.

(1) First of all, a substrate 24 is carried into the process chamber 21, is moved down to the substrate stand 22, and is brought into contact with and placed on the electrostatic chuck 23 (step S11).

(2) The process gas is introduced into the process chamber 21 from the process gas supply 30 via the gas nozzle 30A (S12).

(3) When an inner pressure of the process chamber 21 reaches the predetermined value, a high frequency power is supplied to the substrate stand 22 from the high frequency power supply 25, and discharge plasma 32 is generated as shown in FIG. 5 (step S13). Then, the substrate 24 is dry-etched.

(4) Thereafter, the 1.5 kV positive DC voltage is applied to the conductive layer 23B (shown in FIG. 4) of the electrostatic chuck 23 (step S14). The positive DC voltage is obtained by operating the power supply selecting circuit 45 in response to the control signal from the power supply control circuit 46 and connecting the electrostatic chuck 23 and the positive power supply 41. As a result, the substrate 24 is stuck onto the electrostatic chuck 23. Since the ion sheath layer 32A is formed following the generation of discharge plasma, particles are floating over the ion sheath layer 32A on the substrate 24, and do not fall down directly onto the substrate 24.

In the second embodiment, the positive DC voltage is applied to the electrostatic chuck 23 in 0.1 second to 3.0 seconds, preferably 0.1 second, after the generation of discharge plasma 32, thereby sticking the substrate 24 onto the electrostatic chuck 23. In other words, the substrate 24 is stuck onto the electrostatic chuck 23 on the substrate stand 22 immediately after starting the dry etching, so that a heat radiating space can be formed between the substrate 24 and the substrate stand 22. This is effective in cooling the substrate 24, enabling the substrate 24 to be dry-etched under an optimum condition, and improving manufacturing yield.

The negative voltage supply 42 is dispensable in the system 20 of the second embodiment since it does not use the negative DC voltage.

(5) The substrate 24 is dry-etched following the introduction of the process gas and generation of discharge plasma 32, so that the anti-reflection coating 243 on the substrate 24 is patterned.

(6) After a lapse of the predetermined time period, the positive DC voltage is removed from the electrostatic chuck 23 (step S15) while the process gas is being introduced and discharge plasma 32 is being generated. As described with reference to the Result of New Experiment 4, the ion sheath layer 32A is formed on the substrate 24 during the generation of discharge plasma 32, and particles do not come into contact with the substrate 24.

In the second embodiment, the negative DC voltage is preferably removed from the electrostatic chuck 23 immediately before the termination of discharge plasma generation. For instance, the positive DC voltage is removed 0.1 second to 3.0 seconds, preferably 0.1 second, to the termination of the discharge plasma generation. Therefore, it is possible to shorten the time period between the removal of the positive DC voltage and the termination of the discharge plasma generation, which leads to reduction of overall manufacturing time.

(7) Then, suspending the process gas and terminating the generation of discharge plasma 32 (step S16), the dry etching is completed. The dry-etched substrate 24 is carried out of the process chamber 21 to the unload chamber (not shown).

The method of the second embodiment comprises the steps of placing the substrate 24 on the mono pole type electrostatic chuck 23 on the substrate stand 22 in the process chamber 21; generating discharge plasma 32 in the process chamber 21; applying the positive voltage to the electrostatic chuck 23, sticking the substrate 24 onto the electrostatic chuck 23, and processing the substrate as predetermined using the discharge plasma 32. If no negative DC voltage can be applied to the electrostatic chuck 23, the ion sheath layer 32B is formed on the substrate 24 by generating the discharge plasma 32 prior to the application of the positive DC voltage to the electrostatic chuck 23. As a result, the substrate 24 can be processed in a state free from particles due to the presence of the ion sheath layer 32A.

Further, according to the second embodiment, the positive DC voltage is removed from the electrostatic chuck 23 after dry etching the substrate 24, and then the generation of the discharge plasma 32 is terminated. Therefore, since the ion sheath layer 32A is effective in letting particles float and preventing them from falling onto the substrate 24.

Therefore, this method is free from problems caused by particles, and improves manufacturing yield.

Referring to FIG. 8, the method of the second embodiment shown in FIG. 9 is improved and has 9 faults and the shorting test result of 94%.

Third Embodiment

Figure 10:
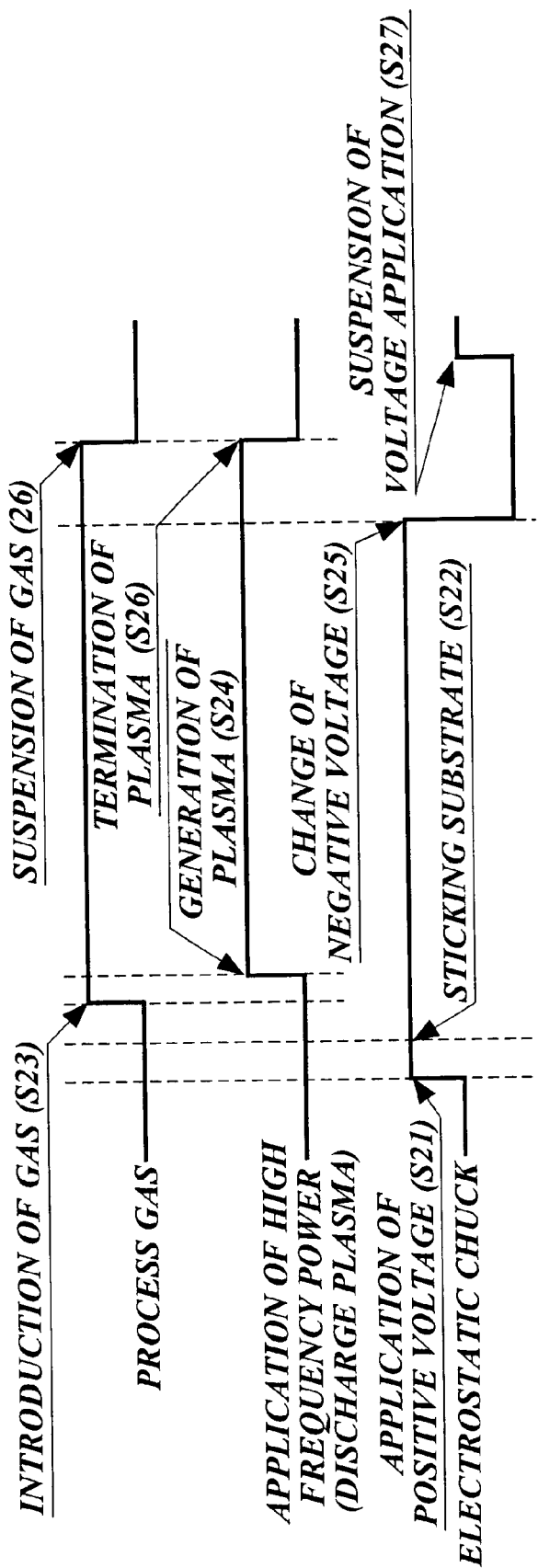
FIG. 10 is a time chart showing a sequence of the electrostatic chuck in a third embodiment.

The method according to the third embodiment includes an optimum sequence for applying both the negative and positive DC voltages to the electrostatic chuck, and will be described with reference to FIG. 10 showing the time chart.

(1) First of all, the substrate 24 is carried into the process chamber 21. The 1.5 kV positive DC voltage is applied to conductive layer 23B (shown in FIG. 4) of the electrostatic chuck 23 (step S 21) before the substrate 24 is placed on the substrate stand 22. This positive DC voltage is obtained by operating the power supply selecting circuit 45 in response to the control signal from the power supply control circuit 46, and by connecting the electrostatic chuck 23 and the positive power supply 41.

(2) The substrate 24 is moved down to the substrate stand 22, is brought into contact with the electrostatic chuck 23, and is stuck onto the electrostatic chuck 23 (step S22) with the positive DC voltage applied to the electrostatic chuck 23.

(3) The process gas is introduced into the process chamber 21 from the process gas supply 30 via the gas nozzle 30A (step S23).

(4) When the inner pressure of the process chamber 21 reaches the predetermined value, high frequency power is applied to the substrate stand 22 from the high frequency supply 25, and discharge plasma 32 is generated as shown in FIG. 5 (step S24), thereby dry-etching the substrate 24. As described with reference to the Result of New Experiment 4, the ion sheath layer 32A is formed in a space between the surface of the substrate 24 and discharge plasma 32. Particles are floating over the ion sheath layer 32A on the substrate 24, and do not fall down and stick onto the substrate 24.

(5) After the lapse of the predetermined time, the positive DC voltage is removed from the electrostatic chuck 23 while the generation of the discharge plasma 32 and introduction of the process gas are being continued. Then, the negative DC voltage is applied to the electrostatic chuck 23 (step S25). The positive DC voltage is switched over to the negative DC voltage by operating the power supply selecting circuit 45 in response to the control signal from the power supply control circuit 46, disconnecting the electrostatic chuck 23 and the positive power supply 41, and connecting the electrostatic chuck 23 and the negative power supply 42. As described with reference to the Result of Experiment 4, the ion sheath layer 32A is formed during the generation of the discharge plasma 32. Particles are floating over the ion sheath layer 32A, and do not stick onto the substrate 24. Further, the application of the negative DC voltage to the electrostatic chuck 23 enables particles from being removed from the surface of the electrostatic chuck 23.

(6) The introduction of the process gas and generation of the discharge plasma are suspended (step S26) while the negative DC voltage is being supplied to the electrostatic chuck 23, so that dry etching is also terminated. In this state, the ion sheath layer 32A disappears between the substrate 24 and the discharge plasma 32. Although particles tend to fall down onto the substrate 24, they can be removed from the surface of the substrate 24 and electrostatic chuck 23.

(7) The application of the negative DC voltage is suspended (step S27), and the substrate 24 is brought out of the process chamber 21 to the unload chamber.

The method of the third embodiment comprises the steps of: placing the substrate 24 on the electrostatic chuck 23 on the substrate stand 22 in the process chamber 21; introducing the process gas into the process chamber 21 and generating the discharge plasma 32 therein, and dry-etching the substrate 24; and applying the negative DC voltage to the electrostatic chuck 23, sticking the substrate 24 onto the electrostatic chuck 23, and at least terminating the generation of the discharge plasma 32. When the generation of the discharge plasma 32 is terminated, the ion sheath layer 32A disappears, and particles tend to stick onto the substrate 24. However, particles cannot stick onto the substrate 24 because the negative DC voltage is applied to the electrostatic chuck 23 following the termination of discharge plasma generation. Therefore, the substrate 24 can be processed as predetermined in the state free from particles, which is effective in improving manufacturing yield of the method.

Further, the method of the third embodiment comprises the steps of: placing the substrate 24 on the electrostatic chuck 23 on the substrate stand 22 in the process chamber 21; introducing the process gas into the process chamber 21 and generating the discharge plasma 32 therein, and dry-etching the substrate 24; at least terminating the generation of the discharge plasma 32; applying the negative DC voltage to the electrostatic chuck 23 either before placing the substrate 24 on the substrate stand 22 or before the termination of the discharge plasma generation, and sticking the substrate 24 onto the electrostatic chuck 23; and removing the negative DC voltage from the electrostatic chuck 23 after the termination of the discharge plasma generation. At the time of termination of the discharge plasma generation, the ion sheath layer 32A disappears, and particles tend to stick onto the substrate 24. However, since the negative DC voltage is applied to the electrostatic chuck 23 after the termination of the discharge plasma generation, particles are prevented from sticking onto the substrate 24. Therefore, the substrate 24 can be processed as predetermined in the state free from particles, which is effective in improving manufacturing yield.

Referring to FIG. 8, the method according to the third embodiment shown in FIG. 10 is improved and has 11 faults and the shorting test result of 91%.

Fourth Embodiment

A semiconductor manufacturing method of the fourth embodiment includes an optimum sequence of the electrostatic chuck, and will be described with reference to FIG. 11.

(1) First of all, the substrate 24 is carried into the process chamber 21 from the load lock chamber. Prior to placing the substrate on the substrate stand 22, the 1.5 kV negative DC voltage is applied to the conductive layer 23B (shown in FIG. 4) of the electrostatic chuck 23 (step S31). As a result, it is possible to remove particles from the surface of the electrostatic chuck 23 as described with reference to the Result of New Experiment 1.

(2) In this state, the substrate 24 is moved down to the substrate stand 22, and is brought into contact with and is stuck onto the electrostatic chuck 23 (Step S32). As described with reference to the Result of New Experiment 2, particles can be removed from the surface of the substrate 24 at an instant the substrate 24 is stuck onto the electrostatic chuck 23.

(3) The process gas is introduced into the process chamber 21 from the process gas supply 30 via the gas nozzle 30A (step S33). As described with reference to the Result of New Experiment 4, it is possible that a few particles are caused when introducing the process gas. However, since the negative DC voltage is applied to the electrostatic chuck 23, and negative charges are induced on the substrate 24, particles can be removed from the surfaces of the electrostatic chuck 23 and the substrate 24.

(4) When the inner pressure of the process chamber 21 reaches the predetermined value, the high frequency power is supplied to the substrate stand 22 from the high frequency power supply 25, thereby generating the discharge plasma 32 (step S34). Then, the substrate 24 is dry-etched. As described with reference to the Result of New Experiment 4, The ion sheath layer 32A is formed between generated discharge plasma 32 and substrate 24, so that particles are floating over the ion sheath layer 32A, and neither directly fall onto the substrate 24 nor stick thereon.

(5) In the predetermined time period, the introduction of the process gas and generation of the discharge plasma 32 are suspended (step S35). In this state, the negative DC voltage is still applied to the electrostatic chuck 23. The ion sheath layer 32A disappears, and floating particles tend to fall onto the substrate 24. However, since the electrostatic chuck 23 remains applied the negative DC voltage, particles falling on the substrate are repulsed and removed.

(6) The negative DC voltage applied to the electrostatic chuck 23 is suspended (step S36), which terminates the dry etching of the substrate 24. Then, the dry-etched substrate 24 is brought out of the process chamber 21 to the unload chamber.

The method of the fourth embodiment assures the advantages obtained by the methods of the first and third embodiments.

Further Embodiments

The preferred embodiments of the invention have been described so far. However, the invention is not limited to them. Alternatively, the invention is applicable to a case in which an electrostatic chuck is composed of a number of pieces, and a single voltage is applied to each of such pieces in order to hold one substrate. In such an electrostatic chuck, one conductive layer constituted by a plurality of pieces is sandwiched between two insulating layers.

Further, the invention is not limited to the dry etching system, but is applicable to a plasma enhanced CVD system for generating discharge plasma in order to process the substrate. Still further, the invention is applicable to a plasma sputtering system in which plasma is generated but no high frequency power is supplied to an electrode for supporting the substrate. The invention does not use a particular method of generating plasma, but is adaptable to generating plasma by the parallel plate type, inductively-coupled type, or electron cyclotron resonance type, and so on.

The invention is advantageous in the following respects. The invention provides the first method which can reduce particles floating over the substrate, which is effective in improving manufacturing yield. Particularly, it is possible to reduce particles on the substrate throughout the processing of the substrate, which is effective in improving manufacturing yield.

The invention provides the second method which can reduce particles on the substrate immediately prior to processing the substrate, which can improve manufacturing yield.

The invention provides the third method which can reduce particles when processing the substrate at least by generating the discharge plasma, which can improve manufacturing yield.

The invention provides the fourth method which prevent particles from sticking onto the processed substrate in addition to the advantage of the third method. This is effective in improving manufacturing yield. Further, the removal of the positive voltage and termination of the plasma generation are performed in a very short time, which is effective in shortening the time to manufacture semiconductor devices.

In the fifth method of the invention, particles are prevented from sticking onto the substrate which is processed using the discharge plasma. This is effective in improving manufacturing yield.

Finally, the invention provides the system for manufacturing semiconductor device which is advantageous as described above.

What is claimed is:

1. A semiconductor device manufacturing method comprising the steps of:
   (1) placing a substrate to be processed on a mono pole type electrostatic chuck on a substrate stand in a process chamber, applying a negative voltage with respect to the ground potential to the electrostatic chuck, and sticking the substrate onto the electrostatic chuck; and
   (2) performing predetermined processing on the substrate with the negative voltage applied to the electrostatic chuck.

2. The method of claim 1, wherein in the step (1), the substrate is stuck to the mono pole electrostatic chuck placed on the substrate stand in the chamber of a dry etching system, a plasma enhanced CVD system, or a sputtering system.

3. The method of claim 1, wherein in the step (2), a surface of the substrate is processed using plasma generated in the process chamber.

4. The method of claim 3, wherein plasma is generated by a diode parallel plate plasma enhanced system, an inductively-coupled plasma system, or an electron cyclotron resonance plasma system.

5. The method of claim 1, wherein in the step (2), the surface of the substrate or a thin film formed on the surface of the substrate is etched.

6. The method of claim 1, wherein in the step (2), a film is formed on a thin film on the surface of the substrate or on the substrate.

7. The method of claim 1, wherein in the step (1), the substrate is placed on the substrate stand and is then stuck onto the electrostatic chuck.

8. The method of claim 1, wherein in the step (1), the substrate is stuck onto the electrostatic chuck while it is being placed on the electrostatic chuck.

9. A semiconductor device manufacturing method comprising the steps of:

(1) placing a substrate to be processed on a mono pole type electrostatic chuck on a substrate stand in a process chamber, applying a negative voltage with respect to the ground potential to the electrostatic chuck, and sticking the substrate onto the electrostatic chuck; and (2) performing predetermined processing on the substrate by introducing a process gas into the process chamber or by generating discharge plasma in the process chamber while the negative voltage is being applied to the electrostatic chuck.

10. The method of claim 9, wherein in the step (2), the substrate is processed by introducing an etching gas or a film forming gas into the process chamber.

11. The method of claim 9, wherein in the step (2), the substrate is processed by generating discharge plasma for etching or film forming.

12. A semiconductor device manufacturing method comprising the steps of:

(1) placing a substrate to be processed on a mono pole type electrostatic chuck on a substrate stand in a process chamber;

(2) generating discharge plasma in the process chamber;

(3) applying a positive voltage with respect to the ground potential to the electrostatic chuck, sticking the substrate to the electrostatic chuck after discharge plasma is generated; and (4) performing predetermined processing on the substrate using discharge plasma.

13. The method of claim 12 further including the step (5) of removing the positive voltage from the electrostatic chuck and terminating the generation of discharge plasma after the step (4).

14. The method of claim 13, wherein in the step (5), the positive potential is removed from the electrostatic chuck 0.1 second to 3.0 seconds prior to the termination of the discharge plasma generation.

15. The method of claim 13, wherein in the step (5), the positive voltage is removed from the electrostatic chuck 0.1 second or less prior to the termination of the discharge plasma generation.

16. A semiconductor device manufacturing method comprising the steps of:

(1) placing a substrate to be processed on a mono pole type electrostatic chuck on a substrate stand in a process chamber;

(2) introducing a process gas into the process chamber, generating discharge plasma, and processing the substrate as predetermined; and (3) applying a negative voltage with respect to the ground potential to the electrostatic chuck, and at least terminating the generation of discharge plasma while the substrate is being stuck onto the electrostatic chuck.

17. A semiconductor device manufacturing method comprising the steps of:

(1) placing a substrate to be processed on a mono pole type electrostatic chuck on a substrate stand in a process chamber;

(2) introducing a process gas into the process chamber, generating discharge plasma, and processing the substrate as predetermined;

(3) at least terminating the generation of discharge plasma;

(4) applying a negative voltage with respect to the ground potential to the electrostatic chuck prior to the step (1) or prior to the step (3), and sticking the substrate onto the electrostatic chuck; and (5) removing the negative voltage from the electrostatic chuck after the step (3).

* * * * *